(12) United States Patent
King

(10) Patent No.: US 7,558,528 B2
(45) Date of Patent: Jul. 7, 2009

(54) WIRELESS LOCAL AREA NETWORK TRANSLATING BI-DIRECTIONAL PACKET REPEATER

(75) Inventor: Wayne G. King, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 1011 days.

(21) Appl. No.: 10/631,634

(22) Filed: Jul. 31, 2003

(65) Prior Publication Data

US 2005/0025085 A1   Feb. 3, 2005

(51) Int. Cl.
*H04B 3/36* (2006.01)
(52) U.S. Cl. .................. 455/7; 455/12.1; 455/11.1; 455/13.3; 455/10; 375/315; 375/319; 375/389
(58) Field of Classification Search ................ 455/7, 455/12.1, 11.1, 13.3, 9, 10; 370/315, 274, 370/279, 293, 492, 319, 389, 535
See application file for complete search history.

(56) References Cited

U.S. PATENT DOCUMENTS

| | | | |
|---|---|---|---|
| 5,815,795 A * | 9/1998 | Iwai | 455/9 |
| 6,690,657 B1 * | 2/2004 | Lau et al. | 370/315 |
| 6,718,159 B1 * | 4/2004 | Sato | 455/11.1 |
| 2007/0025486 A1 * | 2/2007 | Gainey et al. | 375/356 |

OTHER PUBLICATIONS

D-Link Systems Inc. 2002. "Enhanced 2.4GHz (802.11b) Wireless Range Extender." 3pp. Available http://www.dlink.com/products/wireless/dw1800ap+/.
Foxlink/Microlink. 2003. "Wireless LAN Product Line Product Requirements Document (PRD)—Specification for IEEE802.11b/g Wireless LAN Radio Repeater." 21pp. MLPRD802.11b-g WLAN RF Repeater Apr. 4, 2003.DOC.

* cited by examiner

*Primary Examiner*—Vincent P Harper
*Assistant Examiner*—Khai M Nguyen

(57) ABSTRACT

A translating bi-directional packet repeater includes a first antenna and a second antenna for receiving a wireless signal, amplifying it, and retransmitting it on a different channel. The channel associated with each of the antennas is separated in frequency sufficiently to ensure good isolation between the wireless signals that are received and then retransmitted. The wireless signal is down converted to an intermediate frequency (IF) that is passed through a band pass filter, and the filtered signal is then up converted and retransmitted on the different channel. A controller responds to a wireless signal on one of the antennas in selecting a path through the bi-directional amplifier and the antennas used to receive and retransmit the signal. The isolation between the received wireless signal and the retransmitted wireless signal is sufficient to avoid interference, and the retransmission takes place almost instantaneously to minimize the delay incurred.

11 Claims, 4 Drawing Sheets

WIRELESS LOCAL AREA NETWORK TRANSLATING BI-DIRECTIONAL PACKET REPEATER

FIELD OF THE INVENTION

This invention generally pertains to a retransmitter for use in a wireless network, and more specifically pertains to a retransmitter that receives data packets on a first channel of the wireless network and immediately retransmits the data packets on a second channel to extend the range and service of wireless devices communicating on the wireless network.

BACKGROUND OF THE INVENTION

There is an increasing demand for wireless networking devices that can be used to connect a plurality of computing devices together in a network. Most people would prefer to avoid installing the wiring that would be required for a conventional Ethernet network, due to the expense and difficulty. Newer wireless network standards, such as the 802.11 g amendment to the specification established by the Institute of Electrical and Electronics Engineers (IEEE), will enable faster wireless data communication than the earlier 802.11b amendment to the specification. However, there are clearly limits in the range of communication between wireless devices, regardless of the version of the 802.11 specification that is applicable. Most manufacturers of wireless devices specify their range under optimum conditions that often do not exist in the real world. The environment in which wireless devices are used can greatly affect their usable range. For example, when brick and stone, or metal framing are employed for interior walls in the construction of homes and other buildings in which wireless devices are used, these structures substantially attenuate the wireless signals, greatly reducing the effective distance for wireless communications between wireless devices. Consequently, it may be impossible to achieve reliable wireless communications between an access point at one point in a structure and another wireless device located at a disparate point in the structure.

One way to address this problem is to install one or more additional access points, each of which are connected through appropriate Ethernet wiring to a base station or router. However, the installation of additional access points requires adding wiring, which is contrary to the purpose of using a wireless network. Accordingly, it would be preferable to employ a different approach to extend the service range of wireless devices without needing to add wiring to a structure to support additional access points. It should be possible to extend the service range of wireless communications by enabling the wireless signals to be directed around blocking walls and other structural objects within a building and by amplifying the signals.

One approach that might be used for extending the service range of wireless communications employs a repeater. Radio and television signals are often received by a repeater that then repeats the transmission of the signals to extend the coverage range of commercial stations. However, such repeaters are analog device and are typically not bi-directional, since they are designed to receive a signal from a commercial transmitter and repeat the transmission of the signal on another frequency to the receivers (radio or television) in a more distant location. Also, these unidirectional prior art analog repeaters are not usable in a packet network. Unlike the applications for the prior art analog repeaters, a wireless network must be capable of communicating data packets bi-directionally between wireless devices, while avoiding interference between an original signal and the retransmitted signal in either direction of communication.

Range extending repeaters are available for wireless networks, but they use an excessive amount of the available bandwidth. For example, D-Link Corporation's DWL-800AP+™ unit can be configured to operate as a wireless access point or as a repeater for another wireless access point or router. When used in repeater mode, this device substantially increases the demand on the available bandwidth, because it must receive packets from an access point or base station, store the packets, and then retransmit the packets to the intended recipient—on the same channel. Therefore, it takes approximately twice the time normally required to transmit packets to an intended recipient when the repeater is used. Also, the manufacturer cautions that this repeater will only work with certain "compatible access points and routers."

It would be preferable to employ a translating retransmitter that retransmits data packets at about the same time they are received, instead of receiving the data packets, storing them, and then transmitting them in two distinct operations that do not overlap. An appropriate retransmitter should be able to receive data packets from a base station, access point, or wireless device on one channel and within microseconds, transmit the data packets received on another channel, so that there is little perceived delay in the data packets reaching the intended recipient, yet without causing interference between the data packets being received and those being retransmitted. The retransmission should occur sufficiently fast that an acknowledgement for the data packets is received from the intended recipient by the wireless device that originally transmitted the data packets sufficiently soon to avoid the wireless device considering the packets to have been lost. If the acknowledgement is not received within a defined acknowledgement time (referred to as the "ACK time"), which is about 112 microseconds for the IEEE 802.11b specification, the wireless device that originally transmitted the data packets will assume that the transmission was not received, and again transmit the data packets—wasting bandwidth and delaying communications on the wireless network. In contrast, a conventional prior art repeater that has received data packets from the original source sends an acknowledgement back to the original source of the data packets, then transmits the data packets to the intended recipient, and awaits the acknowledgement from the intended recipient. Clearly, it would be preferable to avoid having to send two separate transmission and acknowledgements over the wireless network to complete the communication. By retransmitting data packets sufficiently fast as they are being received, the source transmitter of the data packets on the local area network (LAN) should receive an acknowledgment back from the intended recipient, as if the intended recipient had received the data packets directly from the source transmitter.

Accordingly, it will be apparent that a more efficient use of the broadcast bandwidth should be possible when retransmitting data packets, than is done with prior art repeaters. By enabling the near instantaneous retransmission of data packets so that the intended recipient and the source of the data packets appear to be more nearly in direct communication, much more efficient use of the wireless LAN bandwidth is achieved. Also, data packets should be retransmitted on a different channel than that on which they are received from the original source transmitter, to avoid any interference problems between the original source wireless signal and the retransmitter wireless signal. Currently, none of the prior art wireless devices provide such functionality.

SUMMARY OF THE INVENTION

The present invention extends the range of wireless communication between wireless devices. The present invention is also useful in enabling communication between wireless devices when one or more walls or other elements of a structure in which a wireless network is active are disposed between the wireless devices. Use of the present invention does not significantly reduce the available bandwidth or substantially increase the time for communication between wireless devices, because data packets are retransmitted within microseconds of being received and on a different channel, unlike prior art repeaters that receive, buffer, and then repeat the transmission of data packets on the same channel. In the present invention, upon receipt of the data packets by the intended recipient, an acknowledgment is sent to the original source of the data packets, via the translating bi-directional packet repeater of the present invention.

A first aspect of the present invention is thus directed to a translating bi-directional packet repeater for a wireless network. The translating bi-directional packet repeater includes a first antenna and a second antenna, each of which is associated with a different channel. Specifically, the first antenna is associated with a first channel that operates on a first frequency, and the second antenna is associated with a second channel that operates on a second frequency, which is substantially different than the first frequency. A bi-directional amplifier is selectively coupled to the first antenna and the second antenna and is employed to receive and retransmit a wireless signal comprising data packets. The bi-directional amplifier receives and retransmits the data packets comprising the wireless signal on the different channels without substantially delaying the data packets, and without producing interference between the data packets that are being received and retransmitted. A controller that is coupled to the bi-directional amplifier detects reception of a wireless signal on either the first antenna or the second antenna. In response, the controller selectively configures the bidirectional amplifier to receive the data packets comprising the wireless signal on the channel on which the data packets were detected and causes the bidirectional amplifier to amplify and retransmit the data packets on the other channel, using the other antenna.

The bi-directional amplifier includes a down converter that receives the wireless signal at either the first frequency or the second frequency. The down converter converts the wireless signal to an intermediate frequency signal that is predefined. Also included are a filter that filters the intermediate frequency signal producing a filtered signal, and an up converter that converts the filtered signal to the other of the first frequency and the second frequency, for retransmission.

The filter preferably comprises a bandpass filter that passes a band of frequencies that are generally centered about the intermediate frequency. In a preferred embodiment, the filter comprises a surface acoustic wave (SAW) bandpass filter.

The down converter and the up converter each include an oscillator that produces a mixing signal at a specific frequency, for use in producing the intermediate frequency signal and the filtered signal. Also, one embodiment of the translating bi-directional packet repeater includes another down converter and another up converter for processing wireless signals, so that a different down converter and a different up converter are employed for processing wireless signals that are received on the first channel than on the second channel. The controller selectively determines the down converter and up converter that are employed to process a wireless signal received on either the first antenna or the second antenna.

The bi-directional amplifier preferably includes a radio frequency detector that produces a signal, which is coupled to the controller. This signal indicates the channel on which a wireless signal is being received and enables the controller to select a path for conveying the data packets comprising the wireless signal through the bi-directional amplifier, for retransmission. This signal is also preferably used to drive an indicator that provides an indication of the relative signal strength of the wireless signal that is being received.

Optionally, a switch is provided to enable a user to select the first channel and the second channel employed by the translating bi-directional packet repeater. The two channels are selected from among a plurality of available channels for wireless signals.

In a typical application, the first antenna and the second antenna will preferably be directional antennas that have a preferred direction relative to receiving and transmitting wireless signals. Using such antennas, the translating bi-directional packet repeater can better convey wireless signals between wireless devices disposed at two disparate locations without cross interference, and can retransmit wireless signals so that they are directed around intervening structural elements, such as walls.

Another aspect of the present invention is directed at a method for enabling wireless devices in a wireless network to better communicate by retransmitting wireless signals. The steps of the method generally correspond to the functions implemented by the components comprising the translating bi-directional packet repeater, as discussed above.

BRIEF DESCRIPTION OF THE DRAWING FIGURES

The foregoing aspects and many of the attendant advantages of this invention will become more readily appreciated as the same becomes better understood by reference to the following detailed description, when taken in conjunction with the accompanying drawings, wherein:

FIG. 1 (Prior Art) schematically illustrates a conventional exemplary wireless network that includes a base station and first and second client computing devices that have wireless interfaces, showing how a third client computing device is unable to communicate with the base station due to distance and/or an intervening object, such as one or more walls;

FIG. 2 schematically illustrates a wireless network that includes a translating bi-directional packet repeater in accord with the present invention, which enables the base station and the third client computing device to communicate using wireless signals;

Figure 5:
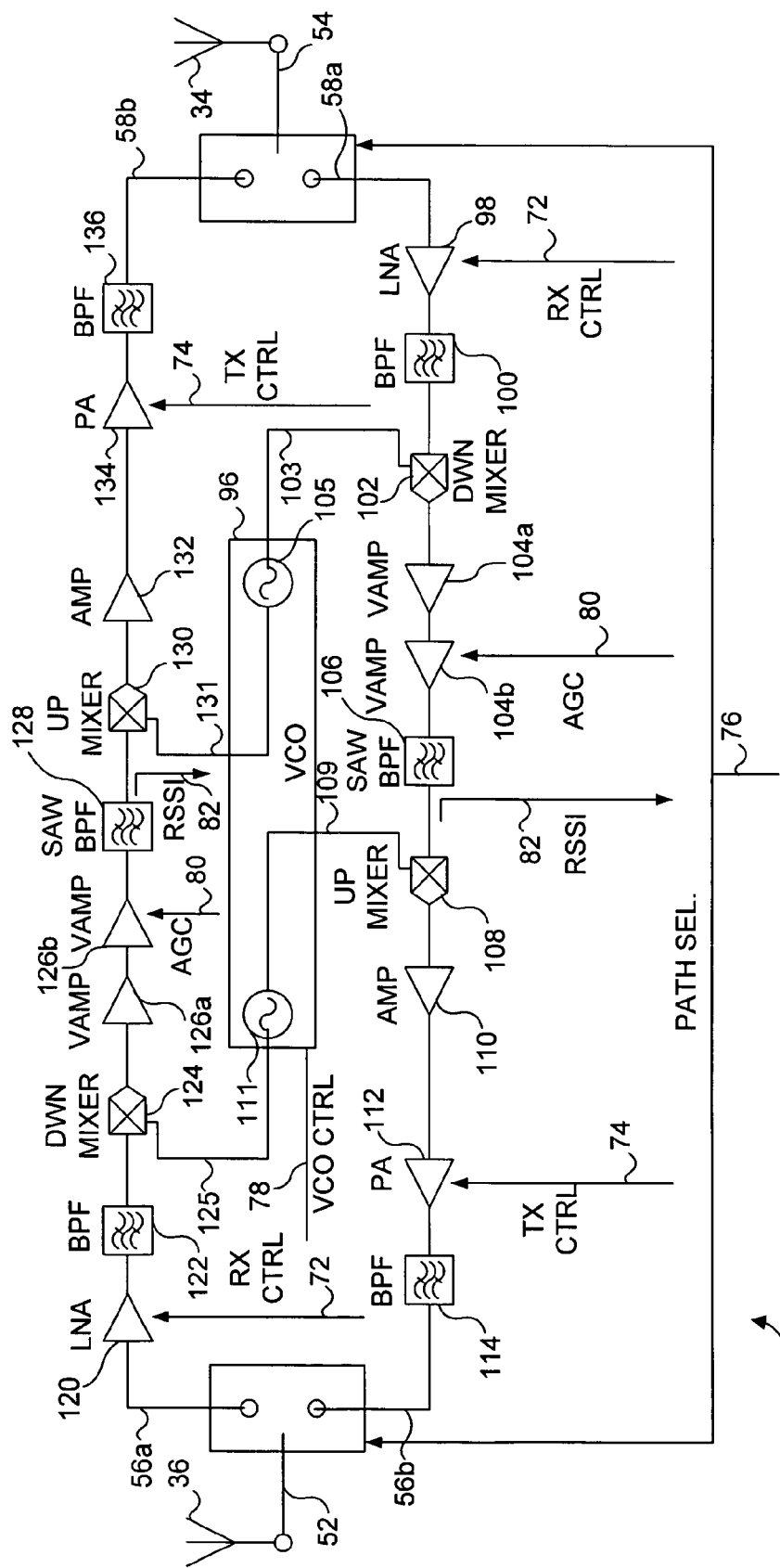
Figure 6:
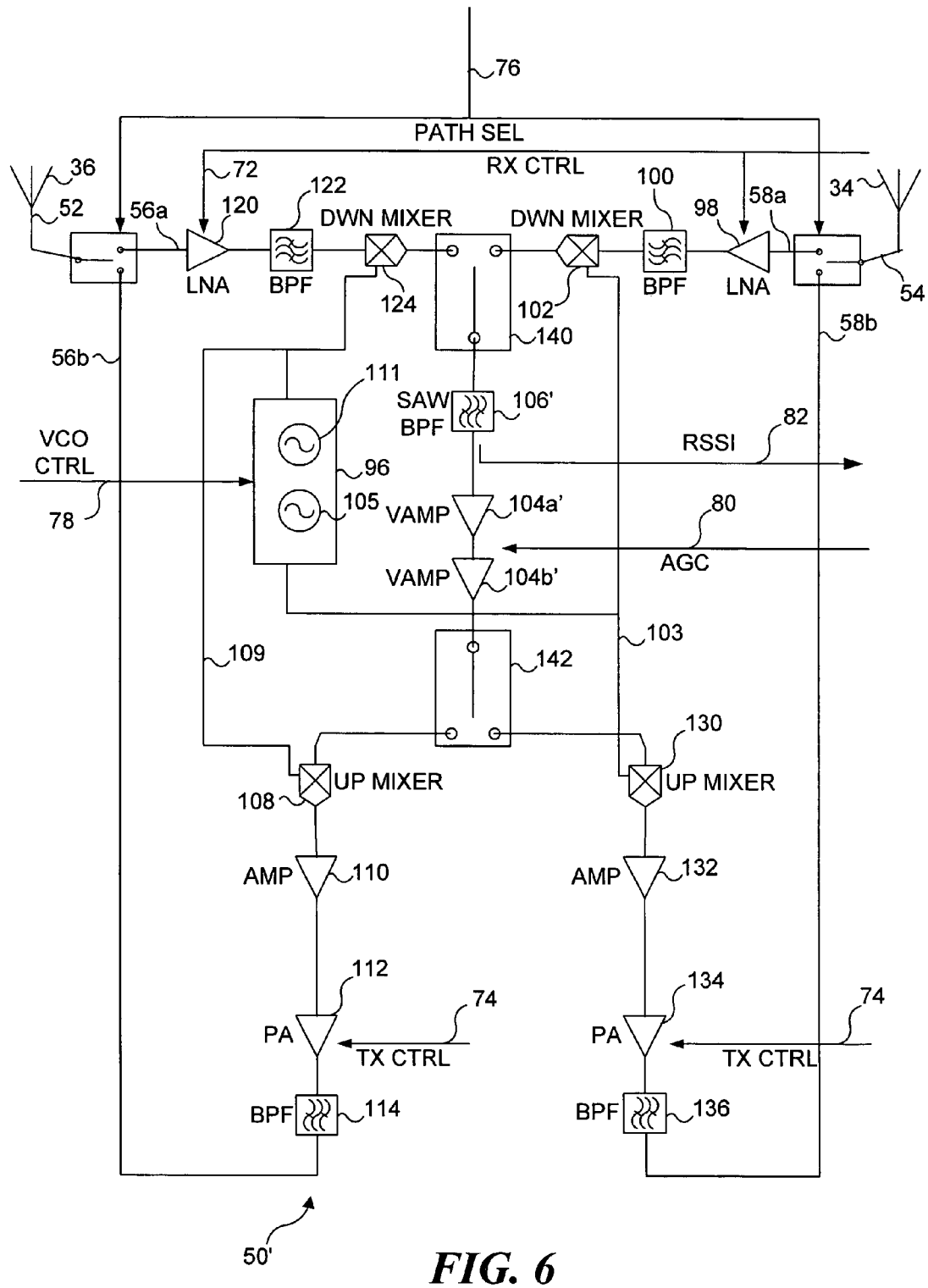

FIG. 5 is a schematic view of one embodiment of a bi-directional amplifier used in the translating bi-directional packet repeater, a controller having been omitted to simplify the illustration; and FIG. 6 is a schematic view of another embodiment of a bi-directional amplifier used in the translating bi-directional packet repeater, the controller again having been omitted to simplify the illustration.

DESCRIPTION OF THE PREFERRED EMBODIMENT

Prior Art Wireless Network Showing Problems Addressed by Present Invention

Figure 1:
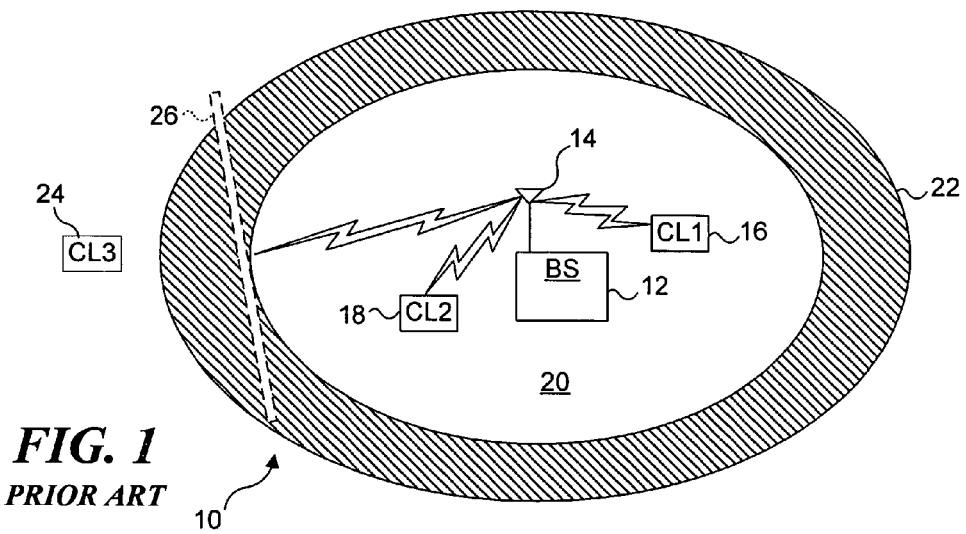

An example of a relatively simple wireless network 10 is illustrated in FIG. 1. This Figure is labeled as prior art and illustrates the problems addressed by the present invention. In this simple example, a base station 12 includes an antenna 14 that transmits and receives wireless signals to and from a first client 16 and to and from a second client 18, each client comprising a computing device such as a laptop having an appropriate wireless interface. The base station and clients are all disposed within a region 20 corresponding to the range of acceptable wireless communications between these components. While indicated schematically as an oval, the region in which acceptable wireless communications can occur between such devices is typically not as regular. Also, as is well known, wireless communications between wireless devices can often be carried out at reduced data rates as the distance between the wireless devices increases or if structures such as a wall 26 are disposed between the wireless devices.

A region 22, schematically shown as an oval, indicates the extent of marginal wireless communications with base station 12. However, a third client 24, which is also provided with a wireless interface, is disposed outside region 20, and even outside of region 22. Third client 24 may be located at too great a distance from base station 12 to communicate with it using a wireless signal, or alternatively (or in addition), wall (s) 26 or other structural elements within a building in which wireless network 10 operates substantially reduce the signal strength of wireless signals transmitted by base station 12 or by third client 24. so that wireless communication between base station 12 and third client 24 is not possible.

Illustrating Use of Present Invention to Address Problem

Figure 2:
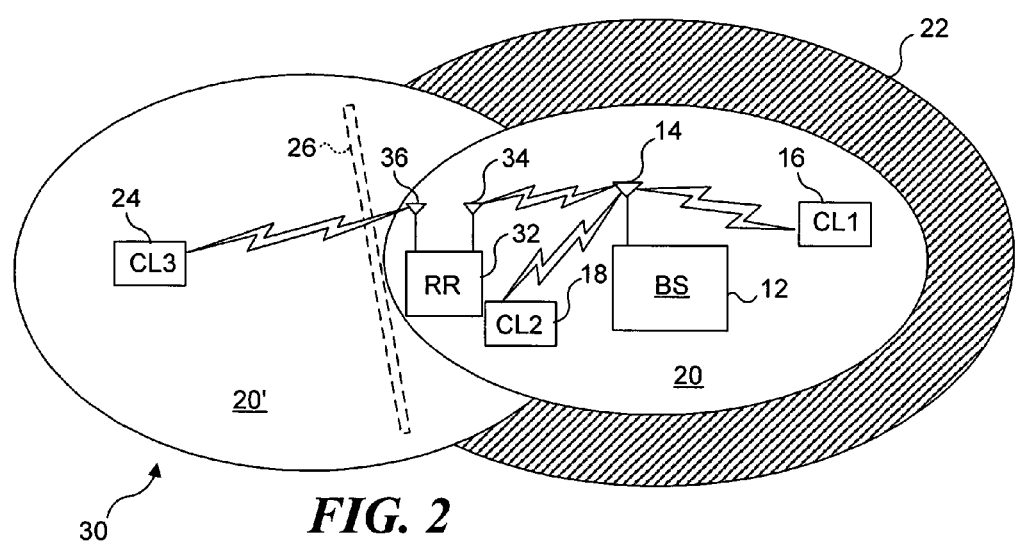

As illustrated in FIG. 2, the present invention provides a solution to this problem. To extend the range of communication between base station 12 and third client 24, a translating bi-directional packet repeater 32 is provided, in accord with the present invention. Translating bi-directional packet repeater 32 includes a first antenna 34, and spaced apart from the first antenna, a second antenna 36. It is preferable to maintain as much separation as possible between first antenna 34 and second antenna 36, to minimize any cross channel interference. A wireless signal transmitted by base station 12 is received by first antenna 34, and the data packets conveyed by the wireless signal are amplified, translated to a different frequency, and immediately retransmitted at that different frequency on a different channel by second antenna 36, so that the data packets conveyed thereby are received by third client 24. Translating bi-directional packet repeater 32 thus produces an expanded region 20' in which wireless communications are possible between base station 12 and a client, such as third client 24. The result is an expanded wireless network 30 in which wireless communication is extended over a substantially greater distance than in wireless network 10 and in which distance and/or intervening structures such as wall(s) 26 do not prevent communication between a client disposed within region 20' and base station 12.

Since base station 12 is generally disposed at a fixed location and often at a cable modem or data subscriber line (DSL) modem to enable sharing the broadband connection with the clients, it will be apparent that first antenna 34 will derive greater benefit from being directional and oriented so that a maximum signal strength is obtained for signals transmitted to and from antenna 14 on base station 12. Similarly, wireless signals transmitted between third client 24 and translating bi-directional packet repeater 32 will more readily be received if second antenna 36 is directional and oriented to provide its optimum signal strength in the direction of third client 24. Use of directional antennas for both first antenna 34 and second antenna 36 also improves the isolation between the first and second channels.

While not shown in the simple example of FIG. 2, it will be evident that translating bi-directional packet repeater 32 could be located adjacent to the end of a wall or other structure, so that wireless signals from base station 12 are received by first antenna 34, and the data packets are then retransmitted by second antenna 36, which is directed in a direction toward third client 24 not aligned with the direction between first antenna 34 and antenna 14. The wireless signals propagating between first antenna 34 and antenna 14, and those propagating between second antenna 36 and third client 24 would form an angle, "effectively wrapping around" and bypassing the intervening structural element or wall. If it is likely that third client 24 will be moved about within region 20', then second antenna 36 can preferably be provided with a relatively wide dispersion (i.e., less directionality) so that all possible dispositions of third client 24 within region 20' are encompassed by the wireless signals transmitted between second antenna 36 and the third client.

Functional Block Diagram of Translating Bi-Directional Packet Repeater

Figure 3:
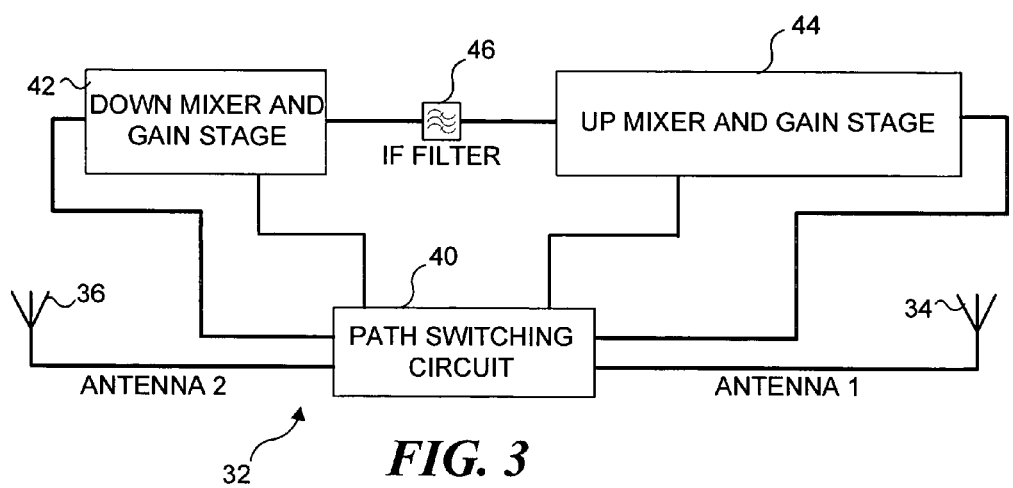
FIG. 3 is a schematic functional block diagram of a translating bi-directional packet repeater in accord with the present invention.

A relatively high-level functional block diagram of translating bi-directional packet repeater 32 is illustrated in FIG. 3. In this diagram, first antenna 34 and second antenna 36 are coupled to a path switching circuit 40. Also connected to path switching circuit 40 are a down mixer and gain stage 42, and an up mixer and gain stage 44. Disposed between down mixer and gain stage 42, and up mixer and gain stage 44 is an intermediate frequency (IF) filter 46.

A key aspect of the present invention is that it uses two wireless channels operating at substantially different frequencies for receiving and retransmitting data packets. The first and second channels are preferably selected, for example, from the wireless channel pairs shown in the following Table 1.

TABLE 1

| Channel Pairs |
| --- |
| 1 and 7 |
| 2 and 8 |
| 3 and 9 |
| 4 and 10 |
| 5 and 11 |

By using one of these channel pairs for the first and second channel, a radio frequency (RF) separation of at least 30 MHz between the two channels is ensured. This separation between channels is important, since translating bi-directional packet repeater 32 is retransmitting data packets from one antenna while receiving data packets on the other antenna, with only a slight delay incurred for amplifying the signals and translating the frequency of the wireless signals to provide isolation between the channels. Use of two separate channels at different frequencies ensures the required isolation between the transmit and receive signals. In addition, first antenna 34 and second antenna 36 are ideally spatially separated sufficiently, e.g., from about 0.2 to 1 meter, to provide sufficient isolation between the antennas to avoid inter-channel interference. The requirements for isolation between the transmit and receive signals is also achieved by using an appropriate filter for IF filter 46 that provides additional isolation. In a preferred embodiment, a SAW filter is used for the IF filter.

Figure 4:
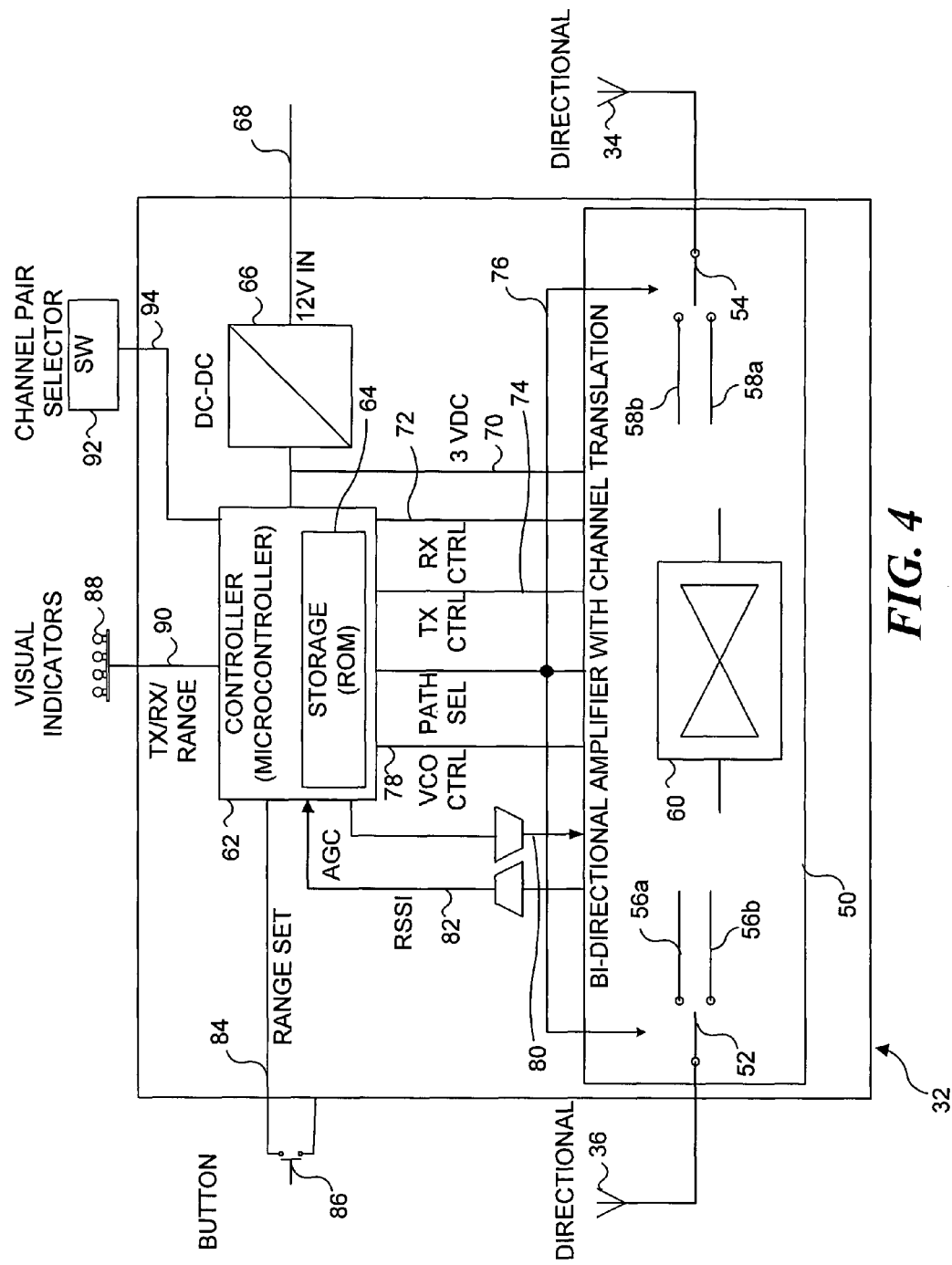
FIG. 4 is a more detailed functional block diagram of the translating bi-directional packet repeater.

FIG. 4 illustrates further details of translating bi-directional packet repeater 32. As shown therein, translating bi-directional packet repeater 32 includes a bi-directional amplifier with channel translation 50. Path switching is carried out using electronically controlled single pole, double throw switches 52 and 54, which determine whether first antenna 34 and second antenna 36 are respectively used for receive and transmit, or transmit and receive functions. Electronic switches 52 and 54 are controlled by a signal conveyed on a path select line 76, which selectively causes electronic switch 52 to couple second antenna 36 either to a line 56a or a line 56b, and selectively cause electronic switch 54 to couple second antenna 36 either to a line 58a or a line 58b. It will be apparent that when first antenna 34 is selectively coupled to receive a wireless signal, second antenna 36 will be selectively coupled to retransmit the wireless signal conveying the data packets of that received signal, and vice versa. The received wireless signal is amplified and processed by a bi-directional amplifier 60 as described below, before being retransmitted on a different channel at a different frequency.

An automatic gain control (AGC) signal is applied through an AGC line 80 to bi-directional amplifier with channel translation 50, to control the gain of the amplification applied by bi-directional amplifier 60. The signals conveyed on lines 72 and 74 respectively control the amplification during receive and transmit, while a line 78 carries a signal applied to a dual voltage controlled oscillator (VCO), which is discussed below in regard to FIGS. 5 and 6.

To determine whether first antenna 34 and second antenna 36 are used for receive or transmit functions, a received signal strength intermediate (RSSI) frequency signal is conveyed on a line 82 from bi-directional amplifier with channel translation 50. This signal is indicative of the strength of the IF signal currently being developed and is therefore indicative of whether first antenna 34 or second antenna 36 is currently receiving a wireless signal. Electronically controlled switches 52 and 54 toggle the paths through the bi-directional amplifier for each antenna between their receive and transmit functions at a sufficiently fast rate so that a wireless signal can be detected on either first antenna 34 or second antenna 36 and processed along the appropriate path without loss of data packets. Path select line 76 conveys a signal to the electronic switches that causes the antenna on which the wireless signal has been detected to receive the wireless signal and conveys the wireless signal thus received on that antenna to bi-directional amplifier with channel translation 50, causing the other antenna to be used for retransmission of the data packets that are processed. Similarly, transmit (TX) control and receive (RX) control lines 74 and 72 control whether amplification is applied to the wireless signal being processed to enable the wireless signal to be retransmitted with sufficient gain to reach the intended recipient.

In addition, the signal indicative of the IF signal strength conveyed on line 82 is also used to control visual indicators 88. The visual indicators are a plurality of light emitting diodes (LEDs), which are lighted to indicate the channel that is currently active as the receive channel and the relative amplitude of the wireless signal strength. Thus, visual indicators 88 can be helpful in selecting a location for translating bi-directional packet repeater 32 and in properly aiming first antenna 34 and second antenna 36 when each is being used to receive a wireless signal. A line 90 conveys the signal indicative of the relative signal strength and of the channel that is being used for receiving a wireless signal, to visual indicators 88.

A line 84 is used for conveying a signal from a push-button switch 86 that is manually actuated by a user to select a desired range for translating bi-directional packet repeater 32. It should be emphasized that button switch 86 is optional, since it may be omitted. In most cases, it will always be preferable that translating bi-directional packet repeater 32 produce a maximum range signal when retransmitting. Push-button switch 86 can be used to limit the range under certain circumstances where it may be undesirable to transmit outside a building or location, for security purposes. Another use of the push-button switch can be to indicate user/manual modes to aid in the positioning of the device. For example, when triggered, the push-button switch can set the device in a listen mode so that the antenna facing the access point can be moved to achieve an optimal position, as indicated by the visual indicators of signal strength.

A channel pair selector switch 92 is coupled to control 62 by a lead 94 and enables a user to selectively choose the specific pairs of channels used for first channel and second channel in translating bi-directional packet repeater 32 (see Table 1). Thus, any of the pairs of channels commonly used for wireless networks noted in Table 1 can be selected with switch 92, as desired by the user. Normally, the user would select an appropriate pair so that the channel used for the antenna directed toward the base station is the same as that used by the base station.

To energize translating bi-directional packet repeater 32, a modular or "brick" power supply (not shown) of a conventional design is provided and is plugged into an AC line outlet (also not shown). The 12 volts DC output of the power supply is conveyed on a line 68 and input to a DC to DC converter 66, which produces a 3 volts DC output that is applied to bi-directional amplifier with channel translation 50 and also to a controller 62 through lines 70. Controller 62 preferably comprises a microcontroller such as that produced by Atmel Corporation and sold under the trademark AVR™ as an eight-bit, reduced instruction set control (RISC) device. Controller 62 includes a storage 64 comprising read only memory (ROM) used to store machine instructions that define the functionality of the microcontroller. It will be apparent that many other types of microcontrollers can alternatively be used for this purpose.

Still further details of bi-directional amplifier with channel translation 50 are illustrated in FIG. 5, although the other components of FIG. 4, including controller 62, are omitted to simplify the illustration. FIG. 5 simply shows the lines that are connected to controller 62 to carry signals to and from bi-directional amplifier with channel translation 50.

In response to a signal provided on path select line 76, electronic switches 52 and 54 are activated to connect first antenna 34 to either receive or transmit a wireless signal and second antenna 36 to either transmit or receive a wireless signal. In addition, the signals on TX control line 74 and RX control line 72 are employed to activate appropriate amplifiers within the circuit shown in FIG. 5. Based upon the signals conveyed on RSSI lines 82, either the first antenna or the second antenna will be used to receive an incoming wireless signal and the other to transmit the corresponding wireless signal on a different channel.

Assuming that a wireless signal is detected on the first channel, which is associated with first antenna 34, electronic switch 54 will maintain first antenna 34 coupled to line 58*a* and second antenna 36 coupled to line 56*b*. The path followed by the received wireless signal is through a low noise amplifier 98, which is controlled by RX control signal line 72. The output of the low noise amplifier is input to a band pass filter (BPF) 100 (optional), which rejects frequencies outside a desired pass band, which is discussed below. The initially filtered signal is applied to a down mixer 102 for mixing with a frequency output from a dual VCO 96. An oscillator 105 included in dual VCO 96 produces the desired frequency signal (in response to an input voltage from the controller supplied on a line that is not shown), and this frequency is conveyed on a line 103 to down mixer 102. The frequency of this signal is selected so that a desired IF signal is produced by the down mixer. In a preferred embodiment, the IF is set to 374 MHz. Thus, the frequency provided by oscillator 105 is selected based upon the channel associated with first antenna 34, since each wireless network channel has a corresponding different frequency. The voltage applied by the controller to oscillator 105 thereby determines the frequency that is input to down mixer 102 to be mixed with the wireless signal.

The resulting IF signal conveys the data packets through a pair of voltage controlled amplifiers (VAMPs) 104*a* and 104*b* (optional). The gain of VAMPs 104*a* and 104*b* is controlled in response to the signal applied through AGC line 80 by the controller and is selectively adjusted by the controller to achieve a desired level. The amplified signal is applied to a SAW BPF 106, and the amplitude of the output from the SAW BPF is detected and conveyed on RSSI line 82. The SAW BPF permits frequencies in the band that is generally centered around the IF to pass through and substantially attenuates out-of-band frequencies, by 40-50 dB or more. The IF is thus filtered the resulting filtered signal is applied to an up mixer 108, which receives a frequency signal on a line 109 from an oscillator 111. Again, the frequency of the signal supplied over line 109 is selected to produce the frequency of the channel selectively associated with second antenna 36, for receiving or transmitting a wireless signal. The output of up mixer 108 is applied to an amplifier 110 and further to a power amplifier 112. Power amplifier 112 is controlled by the signal supplied on TX control line 74. The output of power amplifier 112 is input to another BPF 114, which is coupled to line 56*b*. Again, BPF 114 filters frequencies outside of a desired pass band, as discussed in greater details below, in connection. Electronic switch 52 couples the output of BPF 114 to second antenna 36, so that the data packets conveyed thereby are retransmitted.

As noted above, the amplifiers included in the path of a wireless signal conveyed through bi-directional amplifier with channel translation 50 ensures that the wireless signal that has been frequency translated is retransmitted with sufficient gain and with sufficient isolation from the channel on which the wireless signal was received to avoid interference. A data packet that is received on one of the first and second antennas can be processed through the translating bi-directional packet repeater and retransmitted to the intended recipient in a few microseconds. Once the wireless signal that was retransmitted is received, the intended recipient then transmits an acknowledgement or ACK signal back to the original source of the wireless signal, through the translating bi-directional packet repeater.

If a wireless signal is received by second antenna 36, the controller responds to the signal provided on RSSI line 82 and causes path select line 76 to place electronic switch 52 in a position to maintain second antenna 36 coupled to line 56*a*.

The wireless signal received by second antenna 36 is thus input to a low noise amplifier 120, which is energized by the signal supplied on RX control line 72. The output of low noise amplifier 120 is input to a BPF 122, which filters out-of-band noise, passing only frequencies associated with either all of the wireless channels, or only the frequencies of the channels to which antenna 36 might be set to receive (i.e., Channels 1-5, or alternatively, Channels 7-11). Although not implemented in this embodiment, it is also contemplated that BPF 122 might be programmable to have a pass band centered on the frequency selected for antenna 36. The desired pass bands for BPFs 100 and 114 are selected based on the same considerations. The output of BPF 122 is then applied to a down mixer 124 and mixed with a frequency supplied by oscillator 111 over a line 125. Again, the frequency supplied by oscillator 111 is determined by the voltage input to dual VCO 96 by the controller and is chosen to achieve the desired IF, which is 374 MHz in this embodiment. The IF output from down mixer 124 is input to a pair of VAMPs 126*a* and 126*b*, having a gain controlled by the signal input on AGC line 80 from the controller. Again, the automatic gain control algorithm applied by the controller tries to achieve a desired level for a filtered signal on the output of a SAW BPF 128, as indicated by the signal conveyed to the controller on RSSI line 82.

SAW BPF 128 generally blocks frequencies that are outside the pass band centered around the intermediate frequency, providing the desired isolation between the channel received on second antenna 36 and the channel used for retransmitting through first antenna 34. The filtered signal from SAW BPF 128 is then input to an up mixer 130 and mixed with a frequency supplied on a line 131 from oscillator 105. The resulting output from up mixer 130 is the frequency of the channel associated with first antenna 34. This signal that has been up mixed conveys the data packets that were received on second antenna 36, but has been translated to the frequency of the channel associated with first antenna 34. An amplifier 132 amplifies this signal with a fixed gain and passes the signal to a power amplifier 134, which is controlled by the signal supplied by the controller on TX control line 74. The gain provided by power amplifier 134 and amplifier 132 ensures that the signal strength of the wireless signal transmitted from first antenna 34 is at the required level to reach the intended recipient. The output from power amplifier 134 is input to BPF 136 to attenuate frequencies outside a desired pass band (which are selected as described above in regard to BPF 122) and then supplied through a line 58*b* to electronic switch 54 for retransmission on first antenna 34.

An alternative embodiment of a bi-directional amplifier with channel translation 50' is illustrated in FIG. 6. This embodiment is very similar to that of FIG. 5. Accordingly, the same reference numbers have been used for each of the components of the embodiment shown in FIG. 6 as were used for the embodiment of FIG. 5. The only significant difference between the two embodiments is the use of a single SAW BPF 106' and only one pair of VAMPs 104*a*' and 104*b*' in the embodiment of FIG. 6. In effect, SAW BPF 106' and VAMPs 104*a*' and 104*b*' are shared by each of the separate paths through the bi-directional amplifier with channel translation. To enable this sharing of these components, the embodiment in FIG. 6 includes a double pole, single throw electronic switch 140 that selects between the output of down mixer 124 and down mixer 102 in response to a control signal from the controller, and an electronic switch 142 that selects between the input to up mixer 108 and up mixer 130, again in response to an input signal from the controller. In other respects, the embodiment of FIG. 6 generally functions in an identical fashion to that of the embodiment of FIG. 5. When a wireless signal is detected on first antenna 34 and second antenna 36, the antenna on which the wireless signal was received is locked in receive mode so that the wireless signal being received on it is conveyed through bi-directional amplifier with channel translation 50' and through electronic switches 140 and 142, which are selectively coupled to the appropriate down mixer and up mixer to process the wireless signal. These electronic switches thus ensure that the wireless signal received on one channel is amplified, filtered, and translated for output through the other channel with the appropriate gain and at the required frequency.

Various other alternative arrangements for the circuitry employed in processing wireless signals with translating bi-directional packet repeater 32 can be implemented and such alternatives are well within the ability of one of ordinary skill in the art. The embodiments illustrated and discussed above are simply exemplary of those considered to be acceptable in carrying out the functions of the translating bi-directional packet repeater. Accordingly, the translating bi-directional packet repeater can be implemented as a low cost device that is suitable for receiving and retransmitting data packets conveyed on a wireless signal, with minimal delay, so that an ACK signal is received back from the intended recipient by the original source of the wireless signal before the predefined acknowledgement period expires. The speed of the retransmission ensures that the source of the wireless signal does not again transmit the same data packets, on the assumption that the first transmission has failed to reach the intended recipient. Since data packets are processed by the translating bi-directional packet repeater with very little time delay, efficient use is made of the bandwidth available to the wireless network, and minimal delay is incurred in transmitting data packets from one wireless device to another.

Although the present invention has been described in connection with the preferred form of practicing it and modifications thereto, those of ordinary skill in the art will understand that many other modifications can be made to the present invention within the scope of the claims that follow. Accordingly, it is not intended that the scope of the present invention in any way be limited by the above description, but instead be determined entirely by reference to the claims that follow.

The invention claimed is:

1. A translating bi-directional packet repeater for a wireless network, comprising:
   (a) a first antenna and a second antenna;
   (b) a path switching circuit coupled to the first antenna and the second antenna, said path switching circuit selecting one of the first antenna and the second antenna for use in receiving a wireless signal comprising data packets on a first channel, and selecting the other of the first antenna and the second antenna to retransmit the data packets as another wireless signal on a second channel that is different than the first channel, within a predefined time;
   (c) a down converter and first gain stage selectively coupled to said one of the first antenna and the second antenna by the path switching circuit, said first gain stage amplifying the wireless signal that is received to produce an amplified received signal that is input to the down converter for down converting to an intermediate frequency;
   (d) an up converter and second gain stage selectively coupled to the other of the first antenna and the second antenna by the path switching circuit, said second gain stage amplifying an output of the up converter to produce an output signal that is retransmitted; and
   (e) a filter coupled between the down converter and the up converter, wherein said path switching circuit receives a packet of the wireless signal on said first channel through said one of the first antenna and the second antenna for selective input to the first gain stage, and then couples the output signal from the second gain stage to the other of the first antenna and the second antenna, retransmitting the packet on the second channel with a delay that is substantially less than a required acknowledgement period for the wireless signal.

2. The translating bi-directional packet repeater of claim 1, wherein the filter comprises a bandpass filter that passes a band of frequencies centered about the intermediate frequency.

3. The translating bi-directional packet repeater of claim 1, wherein the filter comprises a surface acoustic wave bandpass filter that passes a band of frequencies centered about the intermediate frequency.

4. The translating bi-directional packet repeater of claim 1, wherein the down converter comprises a down mixer and a first oscillator that produces a first mixing signal having a first specified frequency, said down mixer mixing the first mixing signal with the wireless signal to produce the intermediate frequency.

5. The translating bi-directional packet repeater of claim 4, wherein the up converter comprises an up mixer and a second oscillator that produces a second mixing signal having a second specified frequency for up mixing with the intermediate frequency to produce the output signal.

6. The translating bi-directional packet repeater of claim 5, wherein when the other of the first antenna and the second antenna is receiving the wireless signal, the down mixer mixes the second mixing signal with the wireless signal received on the second channel to produce the intermediate frequency, and the up mixer mixes the first mixing signal with the intermediate frequency to produce the output signal, which is transmitted by said one of the first antenna and the second antenna on the first channel.

7. The translating bi-directional packet repeater of claim 1, further comprising another down converter and another up converter, so that different down converters and up converters are used to process wireless signals received on the first channel and on the second channel.

8. The translating bi-directional packet repeater of claim 1, further comprising a controller that selectively switches paths through the path switching circuit in response to whichever of the first channel and the second channel on which the wireless signal is received.

9. The translating bi-directional packet repeater of claim 8, further comprising a signal detector that is coupled to the controller to provide an indication of the channel on which the wireless signal is being received.

10. The translating bi-directional packet repeater of claim 8, further comprising a signal strength indicator that provides an indication of a relative signal strength of a wireless signal being received.

11. The translating bi-directional packet repeater of claim 1, further comprising a switch that enables a user to select the first channel and the second channel from among a plurality of available channels.

* * * * *